United States Patent
Hsu et al.

(10) Patent No.: US 10,566,285 B2
(45) Date of Patent: Feb. 18, 2020

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chih-Kai Hsu, Tainan (TW);
Yu-Hsiang Hung, Tainan (TW);
Wei-Chi Cheng, Kaohsiung (TW);
Ssu-I Fu, Kaohsiung (TW);
Jyh-Shyang Jenq, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 378 days.

(21) Appl. No.: 15/170,954

(22) Filed: Jun. 2, 2016

(65) Prior Publication Data

US 2017/0323852 A1 Nov. 9, 2017

(30) Foreign Application Priority Data

May 5, 2016 (TW) .............................. 105113924 A

(51) Int. Cl.
| | | |
|---|---|---|
| *H01L 23/535* | (2006.01) | |
| *H01L 29/267* | (2006.01) | |
| *H01L 29/24* | (2006.01) | |
| *H01L 29/165* | (2006.01) | |
| *H01L 29/161* | (2006.01) | |
| *H01L 29/08* | (2006.01) | |
| *H01L 23/528* | (2006.01) | |
| *H01L 21/768* | (2006.01) | |
| *H01L 29/78* | (2006.01) | |
| *H01L 23/485* | (2006.01) | |

(52) U.S. Cl.
CPC ...... *H01L 23/535* (2013.01); *H01L 21/76805* (2013.01); *H01L 21/76816* (2013.01); *H01L 21/76819* (2013.01); *H01L 21/76829* (2013.01); *H01L 21/76895* (2013.01); *H01L 23/485* (2013.01); *H01L 23/5283* (2013.01); *H01L 29/0847* (2013.01); *H01L 29/161* (2013.01); *H01L 29/165* (2013.01); *H01L 29/24* (2013.01); *H01L 29/267* (2013.01); *H01L 29/7848* (2013.01)

(58) Field of Classification Search
None
See application file for complete search history.

(56) References Cited

U.S. PATENT DOCUMENTS

| | | | |
|---|---|---|---|
| 8,124,467 B2 * | 2/2012 | Kronholz | .......... H01L 21/02381 438/197 |
| 8,765,546 B1 | 7/2014 | Hung et al. | |
| 9,640,484 B2 * | 5/2017 | Lu | .......... H01L 23/535 |
| 2007/0262396 A1 * | 11/2007 | Zhu | .................. H01L 21/76816 257/401 |

(Continued)

*Primary Examiner* — Robert K Carpenter
(74) *Attorney, Agent, or Firm* — Winston Hsu

(57) ABSTRACT

A method for fabricating semiconductor device is disclosed. The method includes the steps of: providing a substrate; forming a gate structure on the substrate; forming an epitaxial layer adjacent to the gate structure; forming an interlayer dielectric (ILD) layer on the gate structure; forming a first contact hole in the ILD layer adjacent to the gate structure; and forming a cap layer in the recess, in which a top surface of the cap layer is even with or lower than a top surface of the substrate.

9 Claims, 4 Drawing Sheets

(56) References Cited

U.S. PATENT DOCUMENTS

| | | | |
|---|---|---|---|
| 2011/0287600 A1* | 11/2011 | Cheng | H01L 21/02639 |
| | | | 438/299 |
| 2012/0181625 A1 | 7/2012 | Kwok | |
| 2012/0273798 A1 | 11/2012 | Alptekin | |
| 2015/0069473 A1 | 3/2015 | Glass et al. | |
| 2015/0236124 A1* | 8/2015 | Chang | H01L 29/66628 |
| | | | 257/288 |
| 2016/0020301 A1 | 1/2016 | Park | |
| 2016/0190250 A1* | 6/2016 | Kwok | H01L 29/0847 |
| | | | 257/77 |

* cited by examiner

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of forming a cap layer in a contact hole.

2. Description of the Prior Art

In order to increase the carrier mobility of semiconductor structure, it has been widely used to apply tensile stress or compressive stress to a gate channel. For instance, if a compressive stress were to be applied, it has been common in the conventional art to use selective epitaxial growth (SEG) technique to form epitaxial structure such as silicon germanium (SiGe) epitaxial layer in a silicon substrate. As the lattice constant of the SiGe epitaxial layer is greater than the lattice constant of the silicon substrate thereby producing stress to the channel region of PMOS transistor, the carrier mobility is increased in the channel region and speed of MOS transistor is improved accordingly. Conversely, silicon carbide (SiC) epitaxial layer could be formed in silicon substrate to produce tensile stress for gate channel of NMOS transistor.

Current approach of forming MOS transistor having epitaxial layer is usually achieved by removing part of the interlayer dielectric (ILD) layer to form contact hole after forming an epitaxial layer, and then depositing metals into the contact hole to form a contact plug. This order however easily damages the surface of the epitaxial layer and affects the performance of the device substantially. Hence, how to improve the current fabrication to resolve this issue has become an important task in this field.

SUMMARY OF THE INVENTION

According to a preferred embodiment of the present invention, a method for fabricating semiconductor device is disclosed. The method includes the steps of: providing a substrate; forming a gate structure on the substrate; forming an epitaxial layer adjacent to the gate structure; forming an interlayer dielectric (ILD) layer on the gate structure; forming a first contact hole in the ILD layer adjacent to the gate structure; and forming a cap layer in the recess, in which a top surface of the cap layer is even with or lower than a top surface of the substrate.

According to another aspect of the present invention, a semiconductor device is disclosed. The semiconductor device includes: a substrate; agate structure on the substrate; an epitaxial layer in the substrate adjacent to the gate structure; and a cap layer on the epitaxial layer, in which a top surface of the cap layer is even with or lower than a top surface of the substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
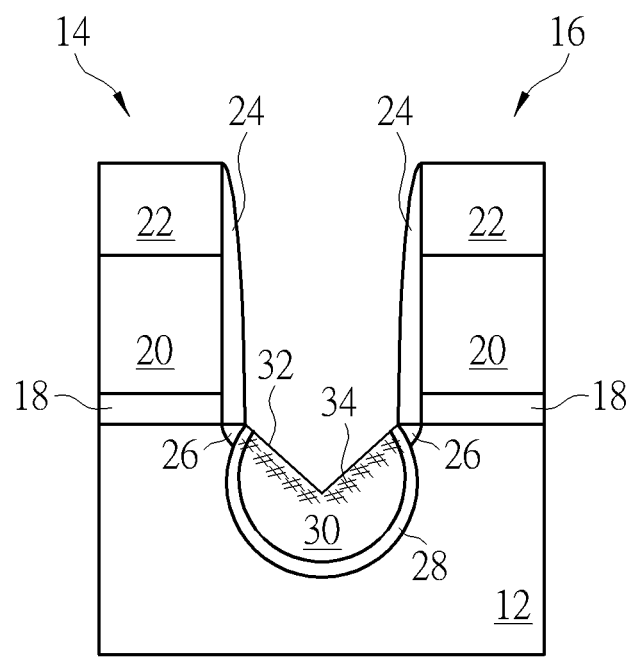
FIGS. 1-6 illustrate a method for fabricating a semiconductor device according to a preferred embodiment of the present invention.

Referring to FIGS. 1-6, FIGS. 1-6 illustrate a method for fabricating a semiconductor device according to a preferred embodiment of the present invention. As shown in FIG. 1, a substrate 12 is provided, and gate structures 14 and 16 are formed on the substrate 12. In this embodiment, the formation of the gate structures 14 and 16 could be accomplished by sequentially forming a gate dielectric layer, a gate material layer, and a hard mask on the substrate 12, conducting a pattern transfer process by using a patterned resist (not shown) as mask to remove part of the hard mask, part of the gate material layer, and part of the gate dielectric layer through single or multiple etching processes, and stripping the patterned resist. This forms gate structures 14 and 16 on the substrate 12, in which each of the gate structures 14 and 16 includes a patterned gate dielectric layer 18, patterned gate material layer 20, and patterned hard mask 22.

It should be noted that to emphasize the formation of epitaxial layer between the two gate structures 14 and 16 in the later process, only two gate structures 14 and 16 are presented in this embodiment and only a partial view of the gate structures 14 and 16, in particular the area between the two gate structures 14, 16 is shown in FIG. 1.

In this embodiment, the substrate 12 could be a semiconductor substrate such as a silicon substrate, an epitaxial substrate, a SiC substrate, or a silicon-on-insulator (SOI) substrate, but not limited thereto. The gate dielectric layer 18 could include $SiO_2$, SiN, or high-k dielectric material; the gate material layer 20 could include metal, polysilicon, or silicide; the material of hard mask 22 could be selected from the group consisting of $SiO_2$, SiN, SiC, and SiON.

In addition, in an embodiment, a plurality of doped wells or shallow trench isolations (STIs) could be selectively formed in the substrate 12. Despite the present invention pertains to a planar MOS transistor, it would also be desirable to apply the process of the present invention to non-planar transistors, such as FinFET devices, and in such instance, the substrate 12 shown in FIG. 1 would become a fin-shaped structure formed atop a substrate 12.

Next, at least one spacer 24 is formed on the sidewalls of the gate structures 14 and 16, and an optional lightly doped ion implantation processes is conducted along with a rapid thermal annealing processes performed at about 930° C. to active the dopants implanted in the substrate 12. This forms lightly doped drains 26 in the substrate 12 adjacent to two sides of the spacers 24. In this embodiment, the spacer 24 may be a single or composite spacer, which may further include an offset spacer (not shown) and a main spacer (not shown). The offset spacer and main spacer could be selected from the group consisting of SiO, SiN, SiON, and SiCN while the offset spacer and main spacer are composed of different material, but not limited thereto.

Next, a dry etching or wet etching process is conducted by using the gate structures 14 and 16 and the spacers 24 as mask to remove part of the substrate 12 along the sidewalls of the spacers 24 for forming a recess (not shown) in the substrate 12.

Next, a buffer layer 28 and an epitaxial layer 30 are sequentially formed in the recess, in which the buffer layer 28 preferably covers the surface of the recess and has a unity thickness. The epitaxial layer 30 fills the most of the recess and may include dopants implanted through in-situ doping process or an extra implantation process to form a source/drain region. A top surface of the epitaxial layer 30 includes a V-shaped profile 32 and the V-shaped profile 32 is slightly lower than a top surface of the substrate 12. In this embodiment, both the buffer layer 28 and epitaxial layer 30 include silicon phosphide (SiP), in which the phosphorus concentration of the epitaxial layer 30 is higher than the phosphorus concentration of the buffer layer 28. According to an embodiment of the present invention, the buffer layer 28 and epitaxial layer 30 could also be composed of SiGe depending on the type of transistor being fabricated, which is also within the scope of the present invention. Moreover, dislocations 34 could be formed during the growth of epitaxial layer 30, in which the dislocations 34 are preferably embedded entirely within the epitaxial layer 30. More specifically, the dislocation 34 itself could include a V-shaped profile, and the two peak points and one valley point of the V-shaped profile of the dislocation 34 are all lower than the surface of substrate 12.

Figure 2:
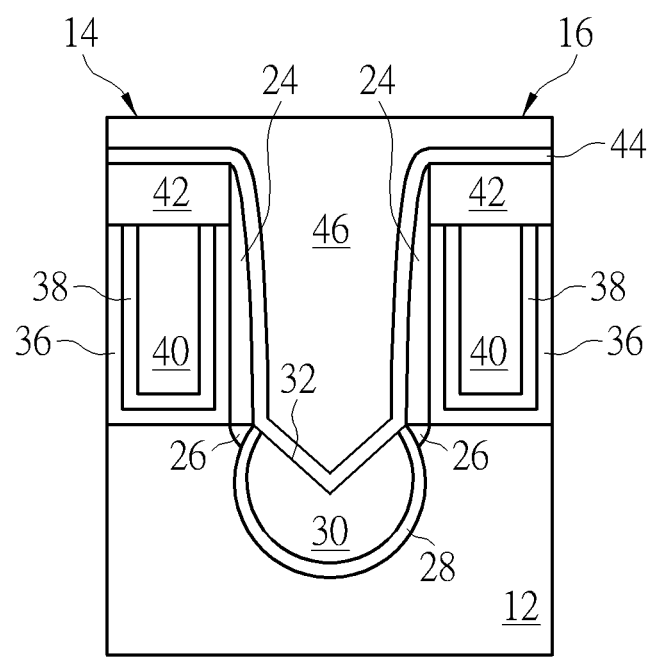

Next, as shown in FIG. 2, a replacement metal gate (RMG) process is conducted to transform the gate structures 14, 16 into metal gates. For instance, an interlayer dielectric (ILD) layer (not shown) could be formed to cover the gate structures 14, 16 completely, and a planarizing process, such as chemical mechanical polishing (CMP) process is conducted to remove part of the ILD layer to expose the hard mask 22 surface. An etching is then conducted to remove the hard mask 22 and expose the gate material layer 20 made of polysilicon.

Next, a selective dry etching or wet etching process could be conducted by using etchant including ammonium hydroxide ($NH_4OH$) or tetramethylammonium hydroxide (TMAH) to remove the gate material layer 20 of the gate structures 14, 16 for forming a recess (not shown) in the ILD layer. Next, a high-k dielectric layer 36, a work function metal layer 38, and a low resistance metal layer 40 are sequentially formed in the recess, and a planarizing process, such as CMP is conducted to remove part of the low resistance metal layer 40, part of the work function metal layer 38, and part of the high-k dielectric layer 36 so that the top surfaces of the ILD layer and high-k dielectric layer 36, work function metal layer 38, and low resistance metal layer 40 are coplanar. Since this embodiment pertains to a high-k last process, each of the gate structures 14, 16 preferably includes a U-shaped high-k dielectric layer 36, a U-shaped work function metal layer 38, and a low resistance metal layer 40.

In this embodiment, the high-k dielectric layer 36 is preferably selected from dielectric materials having dielectric constant (k value) larger than 4. For instance, the high-k dielectric layer 36 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 38 is formed for tuning the work function of the later formed metal gates to be appropriate in an NMOS or a PMOS. For an NMOS transistor, the work function metal layer 38 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 38 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 38 and the low resistance metal layer 40, in which the material of the barrier layer may include titanium (Ti), titanium nitride (TiN), tantalum (Ta) or tantalum nitride (TaN). Furthermore, the material of the low-resistance metal layer 40 may include copper (Cu), aluminum (Al), titanium aluminum (TiAl), cobalt tungsten phosphide (CoWP) or any combination thereof. Since the process of transforming dummy gates into metal gates is well known to those skilled in the art, the details of which are not explained herein for the sake of brevity.

Next, part of the high-k dielectric layer 36, part of the work function metal layer 38, and part of the low resistance metal layer 40 are removed to form recesses (not shown), and hard masks 42 are formed in the recesses so that the top surface of the hard masks 42 and the ILD layer are coplanar, in which the hard masks 42 could be selected from the group consisting of $SiO_2$, SiN, SiON, and SiCN. Next, the ILD layer around the gate structures 14, 16 is removed completely along with the dislocations 34, and a contact etch stop layer (CESL) 44 made of silicon nitride is deposited on the gate structures 14, 16 and the surface of the epitaxial layer 30. Another ILD layer 46 is then formed on the CESL 44 thereafter.

Figure 3:
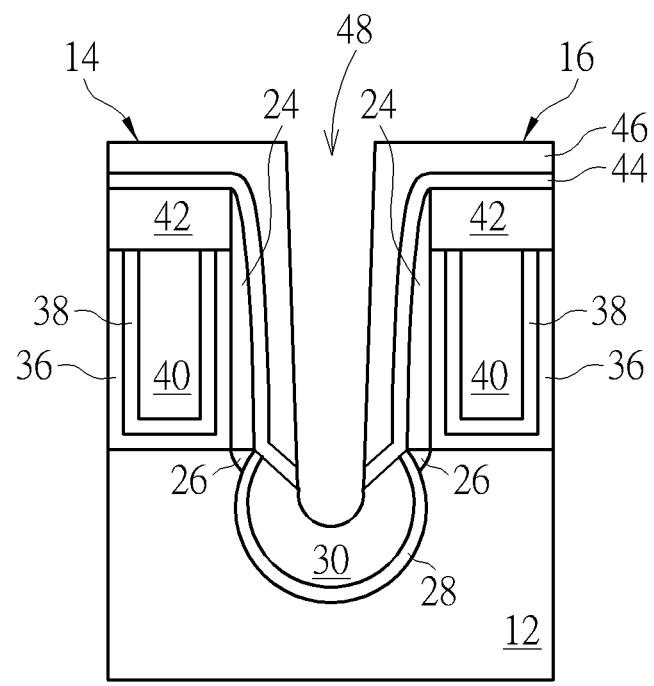

Next, as shown in FIG. 3, a photo-etching process is conducted to remove part of the ILD layer 46, part of the CESL 44, and part of the epitaxial layer 30 between the gate structures 14, 16 for forming a contact hole 48. Preferably, the contact hole 48 is formed within the ILD layer 46 between the gate structures 14, 16 to expose part of the epitaxial layer 30.

According to an embodiment of the present invention, it would also be desirable to form the CESL and a lower ILD layer directly after the epitaxial layer 30 is formed, perform the RMG process, form an upper ILD layer 46 on the lower ILD layer, and perform a photo-etching process to form the contact hole 48 to expose part of the epitaxial layer 30, which is also within the scope of the present invention.

Figure 4:
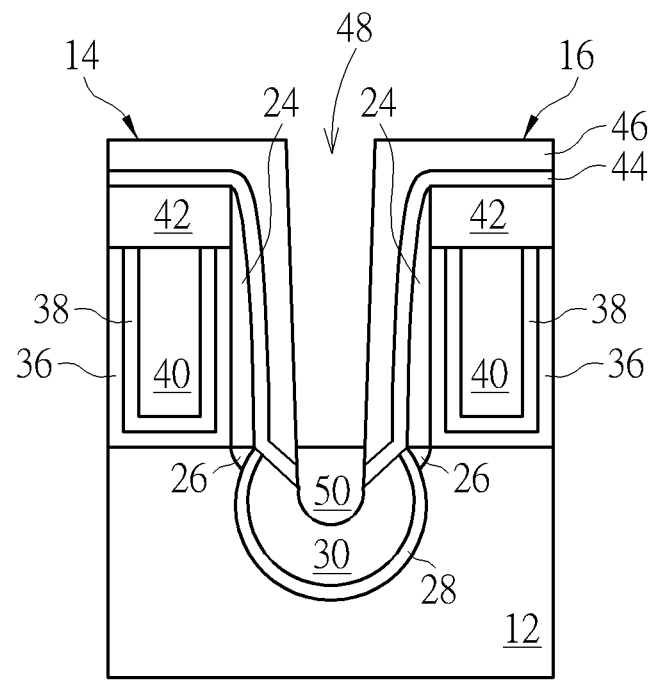

Next, as shown in FIG. 4, a cap layer 50 is formed in the contact hole 48, in which the top surface of the cap layer 50 is preferably even with or lower than the top surface of the substrate 12. It should be noted that if a FinFET device were to be fabricated instead of a planar MOS transistor, the top surface of the cap layer 50 would be even with or lower than the top surface of the fin-shaped structure of the FinFET device on the substrate. In this embodiment, the buffer layer 28, epitaxial layer 30, and cap layer 50 are all made of SiP, in which the phosphorus concentration of the cap layer 50 is preferably higher than the phosphorus concentration of the epitaxial layer 30 while the phosphorus concentration of the epitaxial layer 30 is also higher than the phosphorus concentration of the buffer layer 28. According to an embodiment of the present invention, if the cap layer 50, epitaxial layer 30, and buffer layer 28 were compose of silicon germanium (SiGe), the germanium percentage within the SiGe of cap layer 50 is preferably higher than the germanium percentage within the SiGe of epitaxial layer 30, and the concentration percentage of implanted source/drain dopants such as boron within the SiGe of cap layer 50 is also higher than the concentration percentage of implanted source/drain dopants such as boron within the SiGe of epitaxial layer 30.

For instance, if the cap layer 50, epitaxial layer 30, and buffer layer 28 were all made of SiP, the phosphorus concentration of the cap layer 50 is preferably between $3.51 \times 10^{21}$ $cm^3$ to $5.51 \times 10^{21}$ $cm^3$, and the phosphorus concentration of the epitaxial layer 30 is between $1.0 \times 10^{21}$ $cm^3$ to $3.51 \times 10^{21}$ $cm^3$. If the cap layer 50, epitaxial layer 30, and buffer layer 28 were all composed of SiGe, the concentration percentage of germanium within the cap layer 50 is preferably between 55% to 65% and the concentration percentage of germanium within the epitaxial layer 30 is between 40% to 55%. Since the cap layer 50 and epitaxial layer 30 made of SiGe may also include dopants such as boron for source/drain region, according to an embodiment of the present invention, the boron concentration within the cap layer 50 is preferably between $1.0 \times 10^{21}$ $cm^3$ to $5.0 \times 10^{21}$ $cm^3$ and the boron concentration within the epitaxial layer 30 is between $5.0 \times 10^{20}$ $cm^3$ to $1.0 \times 10^{21}$ $cm^3$.

Figure 5:
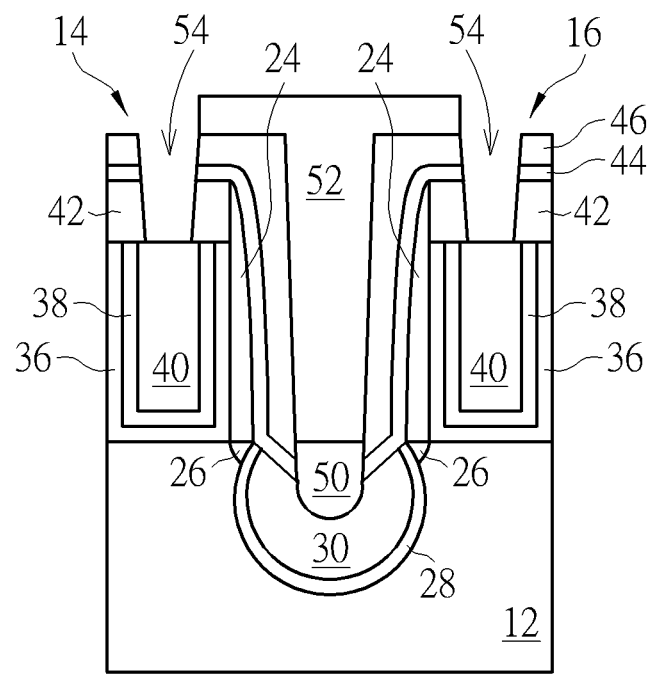

Next, as shown in FIG. 5, a patterned mask, such as patterned resist 52 is formed to fill the contact hole 48 but expose part of the region directly above the gate structures 14, 16, and an etching process is conducted by using the patterned resist 52 as mask to remove part of the ILD layer 46, part of the CESL 44, and part of the hard mask 42 directly on the gate structure 14, 16. This forms contact holes 54 on the gate structures 14, 16, in which the metal material within the gate structures 14, 16 are exposed in the contact holes 54.

Figure 6:
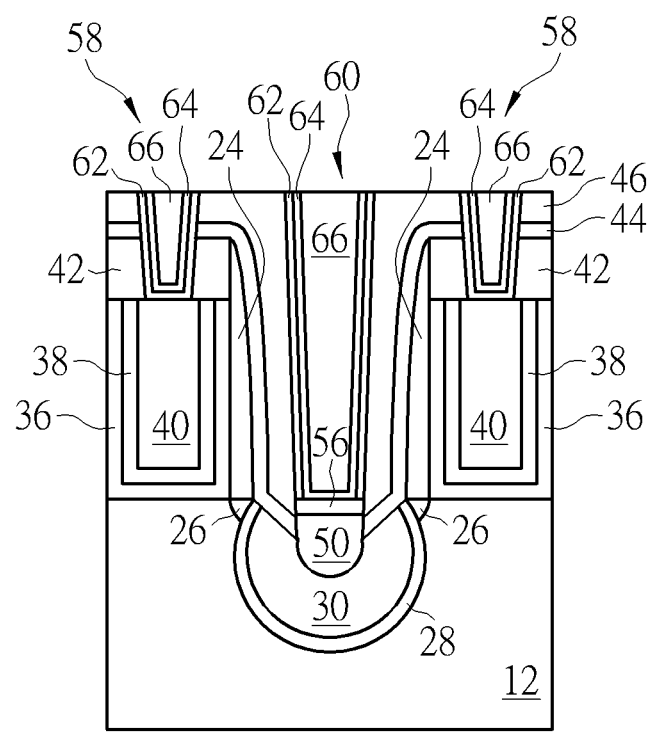

Next, as shown in FIG. 6, after stripping the patterned resist 52, a contact plug formation is conducted with silicide process to form a silicide 56 in the contact hole 48 and a contact plug 58 electrically connected to the epitaxial layer 30 or the source/drain region. In this embodiment, the contact plug formation could be accomplished by sequentially depositing a first metal layer 62 and a second metal layer 64 in the contact holes 54, in which the first metal layer 62 and the second metal layer 64 are formed conformally on the surface of the cap layer 50 and inner sidewalls of the contact holes 48, 54. In this embodiment, the first metal layer 62 is selected from the group consisting of Ti, Co, Ni, and Pt, and most preferably Ti, and the second metal layer 64 is selected from the group consisting of TiN and TaN.

After depositing the first metal layer 62 and second metal layer 64, a first thermal treatment process and a second thermal treatment process are conducted sequentially to form a silicide 56 on the cap layer 50. In this embodiment, the first thermal treatment process includes a soak anneal process, in which the temperature of the first thermal treatment process is preferably between 500° C. to 600° C., and most preferably at 550° C., and the duration of the first thermal treatment process is preferably between 10 seconds to 60 seconds, and most preferably at 30 seconds. The second thermal treatment process includes a spike anneal process, in which the temperature of the second thermal treatment process is preferably between 600° C. to 950° C., and most preferably at 600° C., and the duration of the second thermal treatment process is preferably between 100 milliseconds to 5 seconds, and most preferably at 5 seconds.

After the two thermal treatment processes are conducted, a third metal layer 66 is deposited to fill the contact holes 48, 54 completely. In this embodiment, the third metal layer 66 is composed of tungsten, but not limited thereto. Next, a planarizing process, such as a CMP process is conducted to remove part of the third metal layer 66, part of the second metal layer 64, and part of the first metal layer 62, and depending on the demand of the process also removing part of the ILD layer 46 for forming a contact plugs 58, 60 electrically connected to the gate structures 14, 16 and the epitaxial layer 30. This completes the fabrication of a semiconductor device according to a preferred embodiment of the present invention.

Figure 7:
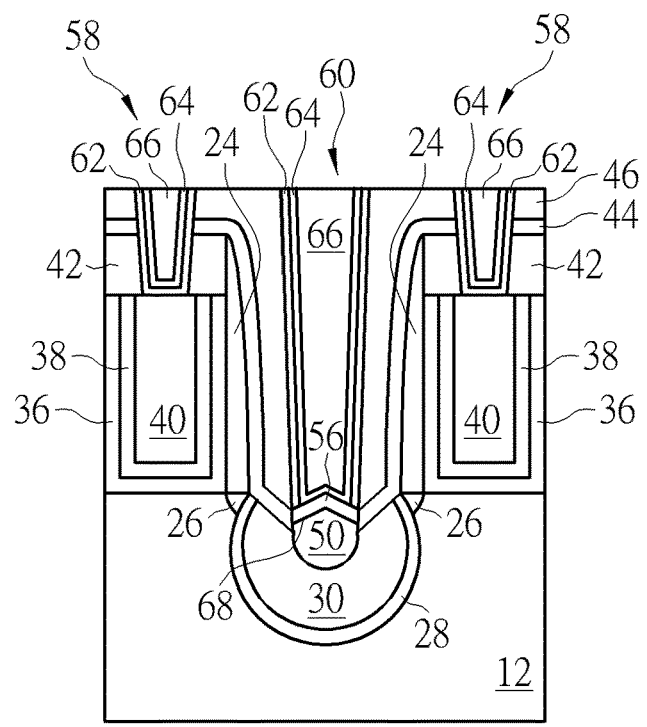
FIG. 7 illustrates a structural view of a semiconductor device according to an embodiment of the present invention.

Referring to FIG. 7, FIG. 7 illustrates a structural view of a semiconductor device according to another embodiment of the present invention. In contrast to the top surface of the cap layer 50 being even with or lower than the top surface of the substrate 12 as shown in FIG. 6, the top surface of the cap layer 50 in this embodiment preferably includes a reverse V-shaped profile 68 protruding upward, in which the peak of the reverse V-shaped profile 68 is even with or slightly lower than the top surface of the substrate 12. Viewing from another perspective, since the top surface of the cap layer 50 includes the reverse V-shaped profile 68, the silicide 56 on top of the cap layer 50 also includes a reverse V-shaped profile.

Figure 8:
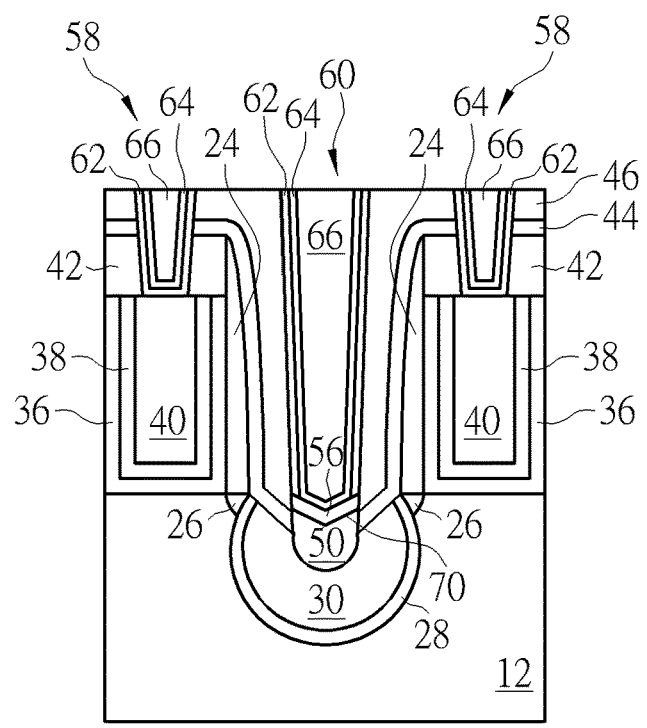
FIG. 8 illustrates a structural view of a semiconductor device according to an embodiment of the present invention.

Referring to FIG. 8, FIG. 8 illustrates a structural view of a semiconductor device according to an embodiment of the present invention. As shown in FIG. 8, top surface of the cap layer 50 includes a concave upward profile or a V-shaped profile 70, in which the two peaks of the V-shaped profile 70 are even with or slightly lower than the top surface of the substrate 12. Viewing from another perspective, since the top surface of the cap layer 50 includes a V-shaped profile 70, the silicide 56 on top of the cap layer 50 also includes a V-shaped profile.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a substrate;
    a gate structure on the substrate;
    an epitaxial layer in the substrate adjacent to the gate structure; and
    a cap layer on the epitaxial layer, wherein a top surface of the cap layer is even with or lower than a top surface of the substrate, the top surface of the cap layer comprises a planar surface parallel to a top surface of the substrate, and a top surface of the epitaxial layer comprises a first planar inclined sidewall extending upward from one end of a curved surface, and a second planar inclined sidewall extending upward from other end of the curved surface, wherein the curved surface is substantially semicircular under cross-sectional view and is in direct contact to sidewalls and a bottom surface of the cap layer.

2. The semiconductor device of claim 1, further comprising:
    an interlayer dielectric (ILD) layer on the gate structure; and
    a first contact plug in the ILD layer and contacting the cap layer.

3. The semiconductor device of claim 2, further comprising a second contact plug in the ILD layer and contacting the gate structure.

4. The semiconductor device of claim 1, further comprising a buffer layer between the epitaxial layer and the substrate.

5. The semiconductor device of claim 4, further comprising a contact etch stop layer (CESL) on the gate structure and contacting the buffer layer and the epitaxial layer.

6. The semiconductor device of claim 4, wherein the buffer layer, the epitaxial layer, and the cap layer comprise same material.

7. The semiconductor device of claim 6, wherein a doping concentration of the cap layer is higher than a doping concentration of the epitaxial layer.

8. The semiconductor device of claim 1, wherein the gate structure is a replacement metal gate comprising of a high-k dielectric layer, a work function metal layer, and a low resistance metal layer.

9. A semiconductor device, comprising:
   a gate structure on a substrate;
   an epitaxial layer in the substrate adjacent to the gate structure; and
   a cap layer on the epitaxial layer, wherein a topmost surface of the cap layer comprises an inverted V-shape and a peak point included by the inverted V-shape without contacting the substrate directly is even with or lower than a top surface of the substrate.

\* \* \* \* \*